United States Patent
Longstone et al.

(10) Patent No.: US 9,065,458 B2
(45) Date of Patent: Jun. 23, 2015

(54) FREQUENCY SYNTHESIS AND NOISE REDUCTION

(75) Inventors: Robert John Mark Longstone, Cowes (GB); Ian Morrison Graham, Newport (GB)

(73) Assignee: BAE SYSTEMS PLC, London (GB)

(*) Notice: Subject to any disclaimer, the term of this patent is extended or adjusted under 35 U.S.C. 154(b) by 100 days.

(21) Appl. No.: 13/641,333

(22) PCT Filed: Apr. 11, 2011

(86) PCT No.: PCT/GB2011/050709
§ 371 (c)(1),
(2), (4) Date: Oct. 15, 2012

(87) PCT Pub. No.: WO2011/128671
PCT Pub. Date: Oct. 20, 2011

(65) Prior Publication Data
US 2013/0033330 A1 Feb. 7, 2013

(30) Foreign Application Priority Data

Apr. 14, 2010 (EP) .................................. 10275035
Apr. 14, 2010 (GB) ................................ 1006193.5

(51) Int. Cl.
*H03B 21/00* (2006.01)
*H03L 7/22* (2006.01)
(Continued)

(52) U.S. Cl.
CPC ............... *H03L 7/22* (2013.01); *H03B 21/025* (2013.01); *H03B 21/04* (2013.01); *H03B 21/01* (2013.01); *H03B 21/00* (2013.01); *H03B 21/02* (2013.01); *H03B 19/00* (2013.01)

(58) Field of Classification Search
CPC ........ H03B 21/00; H03B 21/01; H03B 21/02; H03B 21/025; H03B 21/04; H03B 19/00; H03L 7/22
USPC .............. 331/37, 38, 40, 50, 51, 53; 327/105, 327/113, 355, 356, 100, 115, 116, 117, 119, 327/120, 121
See application file for complete search history.

(56) References Cited

U.S. PATENT DOCUMENTS 2,892,944 A 6/1959 Wu
4,720,688 A * 1/1988 Hasegawa et al. ................. 331/2
(Continued)

FOREIGN PATENT DOCUMENTS

JP 2009-253585 A 10/2009
WO WO 01/24373 A 4/2001

OTHER PUBLICATIONS

International Preliminary Report on Patentability and Written Opinion, dated Oct. 26, 2012 from related International Application No. PCT/GB2011/050709.
Stork, Milan et al., "A Novel Type of Mixer Used for Direct Frequency Synthesis", 2009 16th International Conference on Digital Signal Processing, IEEE (Jul. 5, 2009), Piscataway, NJ, pp. 1-6.
Traverso, Sylvan et al., "A 14-Band Low-Complexity and High-Performance Synthesizer Architecture for MB-OFDM Communication", IEEE Transactions on Circuits and Systems-11: Express Briefs (Jun. 2007), vol. 54, No. 6, pp. 552-556.
(Continued)

*Primary Examiner* — Arnold Kinkead
*Assistant Examiner* — Richard Tan
(74) *Attorney, Agent, or Firm* — Scully, Scott, Murphy & Presser, P.C.

(57) ABSTRACT

A frequency synthesizer and oscillator are disclosed for reducing noise in processed signals. The synthesizer and oscillator comprise an array of frequency dividers adapted to receive an input signal, which is derived from a single signal source having a prescribed frequency. The synthesizer and oscillator further comprise at least one frequency multiplier coupled to at least one of the frequency dividers, such that in use, the dividers and the at least one multiplier are operable to generate a plurality of frequencies which are coherent with the prescribed frequency. A regulated power supply is also disclosed comprising a filter and first and second regulators, for reducing noise in the output voltage of the power supply.

16 Claims, 6 Drawing Sheets

(51) Int. Cl.
 *H03B 19/00* (2006.01)
 *H03B 21/02* (2006.01)
 *H03B 21/04* (2006.01)
 *H03B 21/01* (2006.01)

(56) References Cited

U.S. PATENT DOCUMENTS 4,791,387 A * 12/1988 Hasegawa et al. ............... 331/2
6,005,446 A    12/1999 Galani et al.
6,960,943 B1 * 11/2005 Poulson ...................... 327/105

2008/0233914 A1 * 9/2008 Chen et al. .................... 455/323
2009/0160430 A1 * 6/2009 Brown et al. ............. 324/76.23
2010/0073052 A1 * 3/2010 Choi et al. .................... 327/157

OTHER PUBLICATIONS

Lee, Shao-Hua, "A Frequency Divider Implemented With a Subharmonic Mixer and a Divide-by-Two Divider", IEEE Microwave and Wireless Components Letters (Dec. 1, 2006), vol. 16, No. 12, pp. 699-701.

International Search Report dated Jul. 6, 2011 issued in PCT/GB2011/050709.

Extended European Search Report dated Sep. 30, 2010 issued in European Publication No. EP 10275035.3.

UK Search Report dated Aug. 16, 2010 issued in GB1006193.5.

* cited by examiner

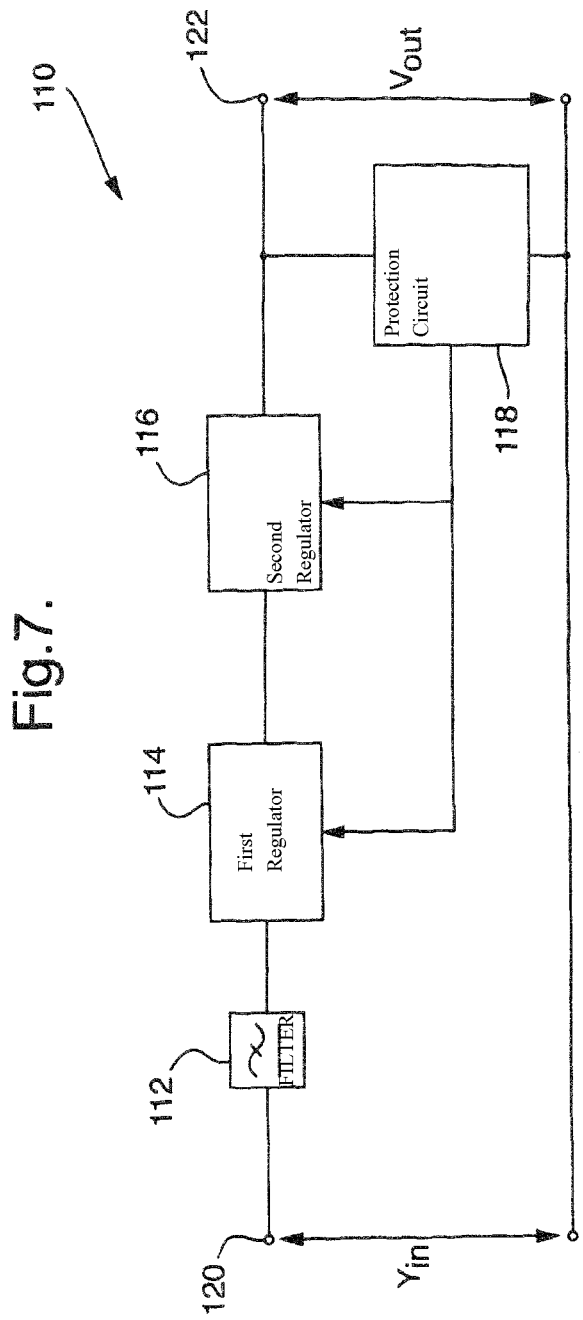

FREQUENCY SYNTHESIS AND NOISE REDUCTION

The present invention relates to improvements in frequency synthesis and to improved devices for reducing noise in processed signals.

There are many applications in the prior art for which it is required to synthesise or generate RF (radio-frequency) signals across a relatively wide range of different frequencies. However, it is known that at least some of the conventional techniques of signal generation and processing may introduce significant noise components into a resulting output signal, unless considerable care is taken to avoid, or mitigate against any potential sources of noise.

In some applications, such as radar systems and RF communications networks, the problem of signal noise may be addressed by using very low noise oscillators, such as those comprising a sapphire-based resonator, which are found to have extremely low phase "jitter" characteristics. Since frequency is the derivative of phase with respect to time, phase jitter can equivalently be represented in terms of frequency jitter. Random phase jitter on an RF signal, manifests itself in the frequency domain as "phase noise", which can be defined as the ratio (expressed in dB) of the power due to phase modulation in a 1 Hz band at a specified offset frequency from the carrier, divided by the wanted carrier power. The upshot of the preceding is that the frequency and phase of the signal will to some extent vary unpredictably, an effect that is often represented in terms of phase noise. As a result, any output signal having an associated phase noise may vary from a desired frequency, which can possibly undermine the performance of the system and/or otherwise introduce undesirable effects.

Although sapphire-based resonators are known to give rise to low phase noise oscillators, they are generally quite expensive components, which usually require reasonably complex arrangements for stabilising the temperature of the resonator due to sapphire having a relatively high temperature coefficient. Hence, unless adequate provision is made for monitoring and controlling the temperature of the resonator, the frequency may drift which can consequently introduce unwanted frequencies into the output signal.

There are several conventional techniques for generating a range of different frequencies from an oscillator, which itself is arranged to generate a single frequency signal. In some applications, such as in radar systems, a set of frequencies may be generated which are integer multiples of a source frequency. Typically, one of the set of frequencies will then be selected for mixing with signals of other frequencies in order to generate a desired output frequency, which is either the sum or the difference of the two input frequencies, depending on the frequency synthesis scheme. In this way, the frequency of the radar signal may then be controllably varied.

However, mixing signals is known to introduce unwanted frequency components, commonly referred to as "mixer intermodulation spurii". The term spurii refers to unwanted, low amplitude, sine wave signals at frequencies other than the desired frequency. A mixer which is driven with a clean (i.e. a single frequency) sine wave input signal is found to produce an output signal comprising frequencies given by the relationship $|\pm n \cdot f_{LO} \pm m \cdot f_{IF}|$ where n and m are integers and $f_{LO}$ and $f_{IF}$ are the frequencies of the local oscillator and intermediate frequency inputs to the mixer, respectively. The wanted mixer output frequency is usually either $|f_{LO}+f_{IF}|$ or $|f_{LO}-f_{IF}|$ with the other mixer output frequencies resulting from the expression $|\pm n \cdot f_{LO} \pm m \cdot f_{IF}|$ constituting unwanted mixer intermodulation spurii. Hence, in conventional mixing techniques, a large number of spurii may be generated, in addition to the resulting frequency, which may also include spurii at which ever of the sum or difference frequencies is undesired. As a result, the wanted output signal may be accompanied by numerous low amplitude sine waves at frequencies which tend to be quite difficult to remove from the signal using conventional filtering techniques.

A set of frequencies which are integer multiples of a source frequency may be generated by way of a conventional comb generator, which when used in conjunction with a switched filter bank, allows one of the frequencies to be selected for subsequent mixing with another signal. However, it is known that such arrangements suffer from the disadvantage that the phase noise of the input signal scales with increasing frequency by a factor of $20 \log_{10}(N)$ dB, where N is an integer multiplier corresponding to the $N^{th}$ harmonic (e.g. N=1, 2, 3, . . . ). As a result, the phase noise rapidly becomes significant at higher frequencies, which adds considerable noise to the output signal. Moreover, it is found that comb generators also produce unwanted harmonics having relatively high amplitudes which must be filtered out before the output signal can be subsequently used.

Hence, it is apparent that many of the conventional techniques of frequency synthesis and signal generation tend to introduce unwanted spectral components (e.g. phase noise and/or spurii) into the output signal, due in part to the action of processing the signal as it passes through the system. Therefore, despite the use of low noise oscillators and frequency synthesisers, many of the existing signal devices are found to generate sets of frequencies that may be associated with significant noise, which can typically require complex filtering and/or further signal processing before the output signals can be used for their intended purposes.

A frequency synthesiser may comprise:
an array of frequency dividers adapted to receive an input signal derived from a single signal source having a prescribed frequency; and
at least one frequency multiplier coupled to at least one of the frequency dividers, wherein in use, the dividers and the at least one multiplier are operable to generate a plurality of frequencies coherent with the prescribed frequency.

The provision of an array of frequency dividers that are adapted to receive an input signal derived from a single signal source having a prescribed frequency allows all of the generated harmonic frequencies to be coherent. By "coherent" we mean that an integer number of cycles of any one of the frequencies is able to 'fit into' an integer number of cycles of any of the other frequencies in the set. An advantage of generating a set of such coherent frequencies is that when two or more of the frequencies from the synthesiser are later mixed, it is found that any resulting spurii are essentially superimposed on top of the desired output frequency, and thus are not seen or, with proper frequency planning, are conveniently spaced from the output frequency to permit ease of filtering.

The provision of at least one frequency multiplier coupled to at least one of the frequency dividers in the array allows a set, $1 \le n \le N$, of harmonics of a prescribed frequency to be generated, where 'N' is the maximum harmonic number required by the frequency synthesis scheme and 'n' is selectable from all the integers between 1 and N. The plurality of frequencies which are coherent with the prescribed frequency are evenly spaced relative to each other. By generating the frequencies in this way, it is found that any noise components associated with the signals (e.g. phase noise and/or spurii) do not interfere with neighbouring harmonics, enabling them to be easily filtered using conventional techniques.

The array of frequency dividers are preferably configured to be in a cascaded arrangement. In other words, the dividers are configured to allow the output of a preceding divider to provide the input to the next adjacent divider, and so on through the array. Each divided frequency is then 'picked off' or tapped at the output of each divider. Although the array of frequency dividers to be discussed later comprises four frequency dividers, it is to be appreciated that the array is inherently scalable and hence any number of frequency dividers may be used in the array, depending on the particular application and desired set of output frequencies.

Each frequency divider may comprise a regenerative frequency divider. An advantage of using regenerative frequency dividers is that they are known to exhibit very low phase noise and consequently the frequency synthesiser is found to generate a relatively low noise set of harmonic frequencies.

In preferred arrangements, the frequency synthesiser comprises a first and second frequency multipliers, with each multiplier being coupled to a respective one of the frequency dividers. The use of a first and second multiplier in conjunction with an array of frequency dividers is found to be particularly advantageous, as each of the first N (e.g. N=1, 2, 3 . . . etc.) harmonics of a prescribed frequency may be generated without interruption. Hence, the frequency synthesiser is able to generate each successive harmonic up to a predetermined integer multiple of the prescribed frequency.

However, it is to be appreciated that any number of multipliers may be used in conjunction with the array of frequency dividers depending on the particular application and number of harmonics that are required. Hence, additional frequency dividers and frequency multipliers may be coupled in such a way as to enable consecutively higher harmonics of a prescribed frequency to be generated.

The array may comprise a plurality of ½ frequency dividers, otherwise known as 'divide-by-2' dividers. Hence, each divider in the array is operable to reduce the frequency of the signal input to the divider by half. It is to be understood however, that each divider may be selected to divide the frequency by any other integer divisor, depending on the particular application and required set of harmonics. Hence, in some arrangements, the array of frequency dividers may be comprised of different value frequency dividers, so that the frequencies of the signals input to the respective dividers may be reduced by different amounts. A useful feature of the divide-by-2 units is that a frequency multiply by 1½ output is also available as a by product of the frequency division method. Accordingly, the array may make use of a plurality of frequency divide-by-2 units some of which are used in the frequency multiply by 1½ mode.

Each one of the first and second frequency multiplier may comprise a ×¾ multiplier. A ×¾ frequency multiplier can be implemented by cascading a ×1½ frequency multiply with a frequency divide-by-2. However, any other multiplier may be used depending on the required set of frequencies from the frequency synthesiser and desired spacing of the harmonics. Moreover, it is to be understood that each multiplier of the first and second multiplier may apply a different multiplication factor to the respective output frequency from the array, so as to generate any particular set of harmonics.

Hence, it is evident that the frequency synthesiser provides a low noise set of harmonics, or integer multiples of a prescribed frequency which are derived in a way which enables easy filtering of any spurii associated with the wanted output signals. Therefore, the present frequency synthesiser is found to be particularly suitable for use with oscillators in low noise applications, such as those required by radar systems and RF communications networks etc.

A signal processing stage for reducing noise in a signal, comprising:
a first and second oscillator coupled via a signal processing path adapted to change the frequency of a signal conveyed along the path, each oscillator being configured to have an operating frequency different to that of the other and dependent on the frequency of the signal provided to the oscillator, wherein, in use, each oscillator is maintained at substantially its respective operating frequency to thereby reduce one or more noise components in the signal conveyed along the path.

The provision of a pair of oscillators which act in combination to facilitate the reduction of one or more noise components in a signal conveyed between the oscillators is found to be particularly advantageous, as the signal can be 'cleaned' by each oscillator in turn, thereby enabling substantial noise suppression as it is processed along the path.

The first and second oscillators may comprise phase locked oscillators.

The signal processing path which couples the oscillators is adapted to change the frequency of the signal that is conveyed along the path. Hence, the path may correspond to a signal channel in a stable local oscillator of a radar system or RF communications network etc. As a result, the path may include one or more frequency multipliers and/or one or more mixers etc. However, is to be appreciated that any suitable means for changing the frequency of the signal may be included in, or otherwise applied to, the signal path.

The first and second oscillators are configured to operate at different frequencies to each other, and have respective operating frequencies which are dependent on the frequency of the signal applied to each oscillator. As a result, the processed signal is cleaned before and after frequency conversion. In this way, the signal processing stage is able to reduce the noise in the signal at two different frequencies along the signal path, which allows any phase noise and/or spurii to be substantially reduced by the processing to provide a clean output signal.

The operating frequencies of the oscillators are such that one of the oscillators operates at a first frequency, and the other oscillator operates at a second, higher frequency. Therefore, in preferred arrangements, the oscillators comprise a low frequency oscillator and a relatively higher frequency oscillator, both being selected to have a respective frequency that matches the frequency of the signal as it is conveyed along the signal processing path.

Each oscillator may be maintained at its respective operating frequency by way of a feedback loop. The action of the feedback loop ensures that the oscillator is maintained or held at a frequency substantially equal to that of the required frequency of the input signal, so that any phase noise and/or spurii associated with that signal are significantly reduced.

The feedback loop applied to each oscillator may be provided by way of a phase locked loop circuit. The circuit may comprise a phase detector comprising an output voltage which depends on the difference in phase between the input signal to the oscillator and the output signal from the oscillator. A loop filter may also be included in the phase locked loop circuit, so that unwanted modulation which may be present on the phase locked loop input signal at modulating frequencies which are significantly higher than the phase locked loop bandwidth, will be significantly suppressed to achieve the 'signal cleaning' attribute of the phase locked loop.

Each oscillator in the signal processing stage is may comprise a dielectric resonator oscillator (DRO) of a type that is preferably voltage controlled. Therefore, the frequency of the oscillator can be varied by adjusting the tuning voltage applied thereto. Hence, when the DRO is incorporated into a phase locked loop circuit, the circuit controls the DRO tuning voltage so that the DRO follows the average frequency of the input signal, while suppressing modulation components of the input signal which are at a modulating frequency and which is significantly higher than the phase locked loop bandwidth, to thereby suppress noise components in the input signal. The use of DROs in the signal processing stage is particularly advantageous as the DROs can be designed to produce lower noise at offset frequencies higher than the phase locked loop bandwidth, than the phase noise of the input signal. As a result, they are ideally suited for reducing noise in signal processing applications where noise components produce rapid phase and/or frequency variations of the phase locked loop input signal.

The dielectric resonator oscillators used in the signal processing stage of are may be fabricated from barium titanate. The use of barium titanate DROs is particularly preferred as barium titanate has a temperature coefficient that is significantly lower than that of sapphire, the commonly used rival material for extremely high Q Microwave resonators. As a result, the barium titanate DROs do not require complex mechanisms for maintaining and controlling their temperature, which is advantageous compared to the temperature stabilisation requirements of sapphire-based resonators. Moreover, barium titanate DROs are significantly cheaper than sapphire-based resonators, which enables signal processing stages, and in turn, stable local oscillators to be constructed at much lower cost than those comprising sapphire-based counterparts.

It is found that the application of a low frequency barium titanate DRO and a relatively higher frequency barium titanate DRO, in combination, gives rise to an output signal that has noise characteristics that are approximately equivalent to those that would be expected from a low noise sapphire-based resonator. Hence, not only is the use of a pair of barium titanate DROs significantly cheaper than a sapphire-based resonator, but the combination is found to have similar operational and performance characteristics to that of more expensive oscillators and signal processing devices.

According to the present invention there is provided a local oscillator comprising:
 a signal source for generating an input signal having a prescribed frequency;
 a first and second oscillator coupled via a first signal path with the signal source;
 an array of frequency dividers coupled via a second signal path with the signal source; and
 at least one frequency multiplier coupled to at least one of the frequency dividers, wherein in use, the dividers and the at least one multiplier are operable to generate a plurality of frequency components of the prescribed frequency for selectively combining with the output from the oscillators on the first signal path.

The provision of an array of frequency dividers and at least one frequency multiplier coupled to at least one of the frequency dividers, functions as a frequency synthesiser for generating a desired number of harmonics of a prescribed frequency. Any frequency from this set of harmonics may then be selected for preferably mixing with the output from the oscillators on the first signal path. As a result, the frequency of the output signal from the local oscillator may then be controllably varied.

Preferably, the first and second oscillators are phase locked oscillators.

Preferably, the array of frequency dividers and at least one multiplier are arranged to generate the harmonics such that the output frequencies are evenly spaced relative to each other. By deriving the frequencies in this way, it is found that unwanted spurii can be easily filtered using conventional filtering techniques.

The array of frequency dividers are preferably configured to be in a cascaded arrangement. In other words, the dividers are configured to allow the output of a preceding divider to provide the input to the next adjacent divider, and so on through the array. Each divided frequency is then 'picked off' or tapped at the output of each divider. The array preferably comprises at least 2 frequency dividers, and most preferably at least 4 frequency dividers. However, it is to be appreciated that the array is inherently scalable and hence any number of frequency dividers may be used in the stable local oscillator, depending on the particular application and desired set of harmonic frequencies.

Each frequency divider is preferably a regenerative frequency divider. An advantage of using regenerative frequency dividers is that they are known to exhibit very low phase noise and consequently the local oscillator of the present invention is found to generate a relatively low noise output signal.

Preferably, the local oscillator comprises a pair of frequency multipliers associated with the array of frequency dividers, with each multiplier being coupled to a respective one of the frequency dividers. The use of a pair of multipliers in conjunction with an array of frequency dividers is found to be particularly advantageous, as each of the first N (e.g. N=1, 2, 3 . . . etc.) harmonics of a prescribed frequency may be generated without interruption. Hence, this particular arrangement is able to generate each successive harmonic up to a predetermined integer multiple of the prescribed frequency.

However, it is to be appreciated that any number of multipliers may be used in conjunction with the array of frequency dividers depending on the particular application and number of harmonics that are required. Hence, additional frequency dividers and frequency multipliers may be coupled in such a way as to enable consecutively higher harmonics of a prescribed frequency to be generated, in accordance with the principles of the present invention.

Preferably, the array is comprised of a plurality of ½ frequency dividers, otherwise known as 'divide-by-2' dividers. Hence, each divider in the array is operable to reduce the frequency of the signal input to the divider by one half. It is to understood, however, that each divider may be selected to divide the frequency by any other integer divisor, depending on the particular application and required set of harmonics. Hence, in some arrangements, the array of frequency dividers may be comprised of different value frequency dividers, so that the frequencies of the signals input to the respective dividers may be divided by different amounts.

Preferably, each one of the pair of frequency multipliers is a ×¾ multiplier. However, any other multiplier may be used depending on the required set of frequencies and desired spacing of the harmonics. Moreover, it is to be understood that each multiplier of the pair of multipliers may apply a different multiplication factor to a respective output frequency from the array, so as to generate any particular spaced set of harmonics.

The provision of a first and second oscillator, coupled via a first signal path with the signal source, enables a signal along that path to be 'cleaned', thereby reducing one or more noise components (e.g. phase noise and/or spurii) in that signal. Cleaning the signal in this way is advantageous as it reduces the noise in the output signal that is to be preferably mixed with one of the harmonics generated by the array of frequency dividers and at least one frequency multiplier.

The first signal path preferably corresponds to a first signal processing path which couples the oscillators to the signal source. In the local oscillator, of the present invention, the first signal path is preferably adapted to change the frequency of the signal that is conveyed along that path. Hence, as a result, the first signal path may include one or more frequency multipliers and/or one or more mixers etc. However, is to be appreciated that any suitable means for changing the frequency of the signal may be included in, or otherwise applied to, the signal path.

The first and second oscillators are preferably configured to operate at different frequencies to each other, and have respective operating frequencies that are dependent on the frequency of the signal applied to each oscillator, and in particular, the phase locked loops which control each oscillator. In this way, the signal on the first signal path may be cleaned before and after its frequency changes. As a result, the signal processing stage is able to reduce the noise in the signal at two different frequencies along the first signal path, which allows any phase noise and/or spurii to be substantially reduced from the signal which is to be preferably mixed with one of the harmonic frequencies.

The operating frequencies of the first and second oscillators are such that one of the oscillators operates at a first frequency, and the other oscillator operates at a second, higher frequency. Therefore, in preferred arrangements, the oscillators comprise a low frequency oscillator and a relatively higher frequency oscillator, both being selected to have a respective frequency that matches the frequency of the signal as it is conveyed along the first signal path.

Each oscillator is preferably maintained at its respective operating frequency by way of a feedback loop. The action of the feedback loop ensures that the oscillator is maintained or held at a frequency substantially equal to that of the frequency of the input signal, so that any phase noise and/or spurii associated with that signal are significantly reduced at offset frequencies substantially higher then the loop bandwidth.

The feedback loop applied to each oscillator is preferably provided by way of a phase locked loop circuit. The circuit preferably comprises a phase detector which has an output voltage which depends on the difference in phase between the input signal to the oscillator and the output signal from the oscillator. A loop filter is also preferably included in the phase locked loop circuit, so that unwanted modulation present on the phase locked loop input signal, at modulating frequencies which are significantly higher than the phase locked loop bandwidth, will be significantly suppressed to achieve the 'signal cleaning' attribute of the phase locked loop.

Each oscillator in the stable local oscillator is preferably a dielectric resonator oscillator (DRO) of a type that is preferably voltage controlled. Accordingly, the frequency of the respective DRO can be varied by adjusting the voltage that is applied to it. Hence, when the DROs are used in combination with a phase locked loop circuit, the circuit can be used to control the respective DRO tuning voltage, which in turn can modify the frequency of the output signal, to thereby reduce modulation at frequencies substantially higher than the phase locked loop bandwidth. The use of DROs in the stable local oscillator is particularly advantageous as these are relatively low cost and low phase noise oscillators.

The dielectric resonator oscillators are preferably fabricated from barium titanate. The use of barium titanate DROs is particularly preferred as barium titanate has a temperature coefficient that is significantly lower than that of sapphire, the commonly used rival material for extremely high Q Microwave resonators. As a result, the present local oscillator does not require complex mechanisms for maintaining and controlling the temperature of the DROs, which is advantageous compared to existing stable local oscillators incorporating sapphire-based DROs. Moreover, since barium titanate DROs are significantly cheaper than sapphire-based resonators, the local oscillator of the present invention may therefore be fabricated at a potentially much lower cost than existing stable local oscillators.

It is found that the application of a low frequency barium titanate DRO and a relatively higher frequency barium titanate DRO, in combination, gives rise to an output signal that has noise characteristics which are substantially equivalent to those that would be expected from a low noise sapphire-based resonator. Hence, not only is the use of a pair of barium titanate DROs significantly cheaper than a sapphire-based resonator, but the combination is found to exhibit similar operational and performance characteristics to that of more complex, and generally more expensive, stable local oscillators.

The second signal path preferably corresponds to a second signal processing path that couples the array of frequency dividers to the signal source. The second signal path may include means for changing the frequency of the signal that is conveyed along that path. Hence, as a result, the second signal path may include one or more frequency multipliers and/or one or more mixers etc. that are arranged to change the frequency of the input signal from the signal source.

The signal source preferably corresponds to a single frequency crystal oscillator, which ideally has an intrinsically low phase noise and low temperature drift. The stable local oscillator architecture is arranged so that the frequencies generated by the oscillator are all coherent with the signal source. By "coherent" we mean that an integer number of cycles of any one of the frequencies is able to 'fit into' an integer number of cycles of any of the other frequencies. A benefit of generating coherent frequencies is that when two or more of the frequencies are subsequently mixed in the stable local oscillator, it is found that, with an appropriate frequency plan, any resulting spurii are essentially superimposed on top of the desired output frequency, and thus are not seen, and/or are else conveniently spaced from the output frequency to permit ease of filtering.

Hence, in accordance with the present invention, the stable local oscillator is configured to only mix coherent frequencies, thereby enabling any spurii to be readily filtered, leading to a low noise, low spurii, output signal.

The single frequency crystal oscillator may be a 'commercial-off-the-shelf' (COTS) component. However, it is to be appreciated that any suitable signal source may be used in conjunction with the stable local oscillator of the present invention, including existing or bespoke oscillators.

Preferably, the local oscillator further comprises means for selecting which one of the set of harmonic frequencies is to be combined (e.g. mixed) with the output signal from the pair of oscillators on the first signal path. The selecting means is preferably a pin diode switch which is coupled to the array of frequency dividers and at least one frequency multiplier. The use of a pin diode switch is particularly beneficial, as appropriately designed pin diodes switches can exhibit low residual phase noise and have very good amplitude and phase settling characteristics after changing switch state, which avoids introducing any additional amplitude and phase perturbations onto the oscillator output signal.

The provision of functionality to select harmonic frequencies within the stable local oscillator for mixing with a 'cleaned' signal on the first signal path, allows the frequency of the output signal from the stable local oscillator to be controllably varied. Hence, the configuration and functionality of the stable local oscillator of the present invention allows the device to be frequency agile, which makes it ideally suited for applications wherein it is necessary to routinely switch frequencies without risk of introducing significant amplitude and phase perturbations into the output signal, e.g. as is essential for radar systems where high rejection of fixed 'clutter' returns is required.

The stable local oscillator may include any number of additional components for processing the signal(s) within the device, including, but not limited to, signal splitters, bandpass filters and amplifiers, as required. Moreover, in radar applications for example, the stable local oscillator may also include further signal stages or modules, including an up-converter and receiver, comprising a digital waveform generator and analogue-to-digital converter respectively.

A regulated power supply may comprise:
an input terminal for receiving an input voltage, and an output terminal for providing a regulated output voltage;
a filter; and
first and second regulators, coupled to each other and to the filter, wherein at least one of the regulators is operable to reduce noise in the output voltage by regulating relatively low frequency components in the input voltage.

At least one of the regulators may be operable to reduce noise in the output voltage by operating with low loop bandwidth so as to suppress high frequency noise and ripple components.

This mode of operation can be applied in systems where the current demanded from the power supply is essentially constant, or at least very slowly varying, which is typical for the majority of the stable local oscillator circuitry.

In signal processing applications, it is important to avoid introducing noise and spurii components during processing of the signal. One such source of noise and spurii is typically the power supply to components within the signal device (e.g. frequency dividers and amplifiers in a stable local oscillator). The mechanism by which power supply noise and ripple results in noise and spurii is by power supply voltage to amplitude modulation and power supply voltage to insertion phase modulation occurring in the devices through which the RF signal is passed. As a result, any voltage ripples in the supply may therefore produce power supply induced amplitude and insertion phase modulation within the components, which can give rise to significant amplitude noise, phase noise and spurii in any generated frequencies.

The provision of a regulated power supply comprising at least one regulator which is operable to reduce noise in an output voltage by reducing high frequency noise and ripple components through operating with low loop bandwidth, is particularly advantageous for many applications, including, but not restricted to radar, as it allows noise sensitive components to be supplied with a voltage having a relatively low voltage noise or 'ripple' particularly in the higher frequency ranges, which can have a significant impact on system operation.

The first and second regulators may comprise linear regulators. The first regulator is may comprise a commercial-off-the-shelf (COTS) device, which functions as a first voltage stabilisation stage and which provides useful rejection to noise and ripple components present in its input voltage. The first regulator however, may not itself have particularly low output noise due to its own internal noise sources. Therefore, the first regulator acts as a conventional linear voltage regulator.

The second regulator may comprise a noise reduction regulator which is operable with low loop bandwidth to act as a low pass filter to the noise and ripple component of the regulator input voltage and also to provide suppression of the regulator's own internal noise sources at frequencies above the regulator's loop bandwidth. Since the regulated power supply is preferably intended for use with components such as frequency dividers and amplifiers etc., the supply does not need to respond to rapid changes in current, as these components only typically require a constant current supply. Therefore, the second regulator is preferably configured to have a loop bandwidth below 10 kHz.

To avoid the risk of over voltage occurring at the power supply output terminal, each regulator is preferably configured to limit the output voltage in response to a failure of either of the first or second regulators, but not both. This is achieved by the second regulator being operated with a low differential between its input and output voltages, so that the second regulator can fail with its output voltage equaling its input voltage, without damage occurring to items powered from the power supply. This ensures that the second regulator can withstand the input voltage which is applied to the first regulator, so that in the event of the first regulator failing with its output voltage equalling its input voltage, the second regulator will still continue to provide the correct regulated output voltage. In this way, any potential damage to any of the signal processing components due to over voltage can be considerably reduced.

Each regulator may comprise a conventional shunt which acts to protect any connected signal processing components from an over-voltage event (e.g. voltage spike).

To provide further protection against any undesirable voltage spikes, the regulated power supply may additionally comprise an over-voltage protection circuit that is configured to attempt to shut down both regulators in the event of over voltage being detected.

The filter may comprise a low pass (passive) filter that attenuates high frequency noise components in the input voltage. The filter incorporates resistive losses in both the series and shunt elements to ensure that the filter can operate to suppress input ripple and noise, at all frequencies where the input voltage has significant spectral content, in the presence of uncertain primary supply impedance. However, any suitable filter may be used in conjunction with the regulated power supply.

Embodiments of the invention will now be described in detail by way of example and with reference to the accompanying drawings in which:

FIG. 7 is a schematic diagram of a low noise power supply.

Figure 1:
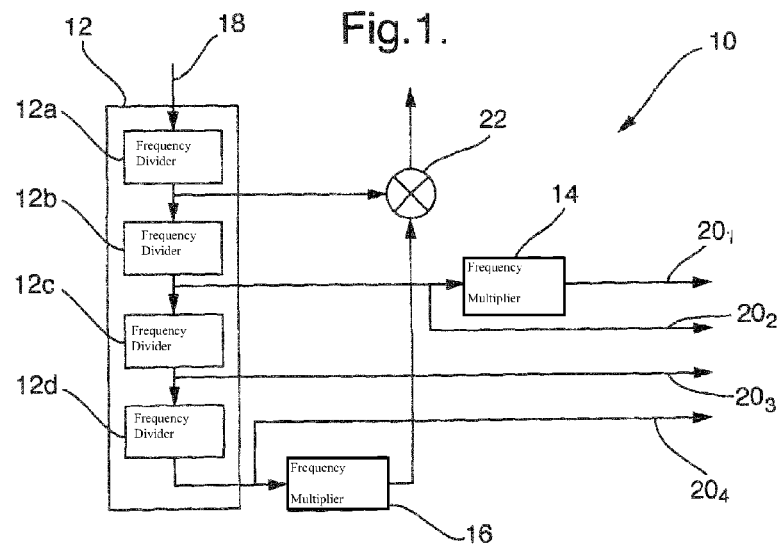
FIG. 1 is a schematic diagram of a frequency synthesiser.

Referring to FIG. 1, there is shown a schematic diagram of an example frequency synthesiser 10. The frequency synthesiser 10 comprises an array 12 of four frequency dividers 12*a* . . . 12*d*, which are arranged in a cascaded configuration. In this way, the output of a preceding divider becomes the input to the next adjacent divider, and so on through the array 12. Each divided frequency can then be 'picked off' at the output of each divider 12a . . . 12d.

The frequency synthesiser 10 further comprises a pair of frequency multipliers 14, 16, each of which is coupled to a respective one of the frequency dividers in the array 12. In the example of FIG. 1, one of the frequency multipliers 14 is coupled to the output of the second frequency divider 12b, such that it is able to receive the signal from that divider, while the other frequency multiplier 16 is likewise coupled to the output of the last frequency divider 12d.

The frequency dividers 12a . . . 12d in the array 12 are each ½ frequency dividers or 'divide-by-2' dividers. Therefore, each divider 12a . . . 12d in the array 12 is operable to divide the frequency of the signal input to the respective divider by one half. The frequency multipliers 14, 16 are each ×¾ multipliers, that serve to multiply the frequencies of the signals received from the respective dividers 12b, 12d by ¾. These ×¾ multipliers are implemented by a cascade of two regenerative frequency dividers of the type shown in FIG. 2, where the output which provides ×3⁄2 the input frequency, is taken from the first regenerative divider and supplied to the input of the second regenerative divider from which the half frequency output is taken.

The array 12 is configured to receive an input signal 18 derived from a signal source having a prescribed frequency. An advantage of the circuit illustrated FIG. 1, is that the set of frequencies generated by the frequency synthesiser 10 will all be coherent with each other. By "coherent" we mean that an integer number of cycles of any one of the frequencies is able to 'fit into' an integer number of cycles of any of the other frequencies in the set. A significant benefit of generating a set of such coherent frequencies is that when two or more of the frequencies are later mixed, it is found that any resulting spurii are essentially superimposed on top of the desired output frequency, and thus are not seen or with an appropriate frequency plan, are else conveniently spaced from the output frequency to permit ease of filtering using conventional techniques.

The particular arrangement of frequency dividers 12a . . . 12d and frequency multipliers 14, 16 as shown in FIG. 1, enables harmonics 1 to 4 of a prescribed frequency to be generated, while also providing additional output frequencies for further mixing. The values of the frequency dividers 12a . . . 12d and frequency multiplier 14 are specially selected so that the output frequencies generated by the frequency synthesiser 10 are evenly spaced relative to each other. Therefore, the set of frequencies on the output channels $20_1 \ldots 20_4$ are each spaced by a predetermined difference in frequency.

By way of example, the operation of the frequency synthesiser 10 will now be illustrated with reference to an input signal 18 having a frequency of 1280 MHz, derived from a signal source (not shown) having a prescribed frequency of 80 MHz. The frequency of the input signal 18 is initially reduced by the divide-by-2 frequency divider 12a, so that the output signal from the divider now has a frequency of 640 MHz. This output signal is then provided to the divide-by-2 frequency divider 12b, which again divides the frequency of the signal by one half. The output signal now has a frequency of 320 MHz, which is made available on channel $20_2$. Due to the coupling of the frequency multiplier 14 to the output of frequency divider 12b, it too receives the 320 MHz signal, which is thereby multiplied by ¾ giving a further output signal having a frequency of 240 MHz on channel $20_1$.

Due to the cascading of the frequency dividers, the 320 MHz output signal is also provided to the divide-by-2 frequency divider 12c, which again divides the frequency by one half. In this way, an output signal having a frequency of 160 MHz is made available on channel $20_3$, while also being provided to the final divide-by-2 frequency divider 12d, which divides the 160 MHz signal into an output signal of 80 MHz. The 80 MHz signal is then made available on channel $20_4$. As a result, an evenly spaced set of the first four successive harmonics (i.e. 80 MHz, 160 MHz, 240 MHZ and 320 MHz) of the prescribed (i.e. fundamental) frequency 80 MHz can be obtained from the channels $20_1 \ldots 20_4$ of the frequency synthesiser 10.

Deriving the output frequencies in this way, thereby enables spurii to be easily filtered, as the regenerative frequency dividers provide useful suppression of unwanted harmonics. However, it is to be appreciated that by adjusting the values of the frequency dividers 12a . . . 12d and/or frequency multipliers 14, 16, together with potentially changing the size of the array 12 and/or number of multipliers, can enable different frequency spacings to be achieved, as required by the particular application.

In the example of FIG. 1, the output signal from the first divider 12a may be optionally coupled to a mixer 22, which can also be configured to receive the output signal from the ×¾ frequency multiplier 16. The mixing of these two output signals can therefore provide a new output signal which may be used for additional mixing in any suitable signal processing stage (not shown), to thereby generate one or more further frequencies, in addition to the harmonics available on the channels $20_1 \ldots 20_4$. Hence, not only can the frequency synthesiser of FIG. 1 be used to generate the first four harmonics of a prescribed source frequency, it can also give rise to further frequencies for optional mixing purposes.

The frequency dividers 12a . . . 12d used in the frequency synthesiser 10 of FIG. 1 are each regenerative frequency dividers. An example of such a regenerative frequency divider 30 is shown schematically in FIG. 2. The regenerative frequency divider 30 comprises a mixer 32 coupled to a low pass filter 34, which in turn feeds an amplifier 36. The output signal from the amplifier 36 is returned to the mixer 32 via a frequency multiplier 38, for mixing with the input signal $f_i$ provided to the regenerative frequency divider 30.

The mixer 32 effectively serves as an analogue multiplier that generates two output signals with frequencies, $f_{out\_upper}$ and $f_{out\_lower}$, which are equal to the sum and difference of the two input frequencies respectively. Considering the function of the mixer 32, assuming that the filter 34 selects the lower output sideband from mixer 32, it follows that: $f_i - N \cdot f_{out\_lower} = f_{out\_lower}$, therefore $$f_{out\_lower} = \frac{f_i}{(N+1)} \qquad (1)$$

where N is the multiplicative factor of the frequency multiplier 38. Furthermore, it also holds that $$f_{out\_upper} = f_i + N \cdot \frac{f_i}{(N+1)},$$

which therefore gives $$f_{out\_upper} = f_i \cdot \frac{(2 \cdot N + 1)}{(N+1)} \qquad (2)$$

Figure 2:
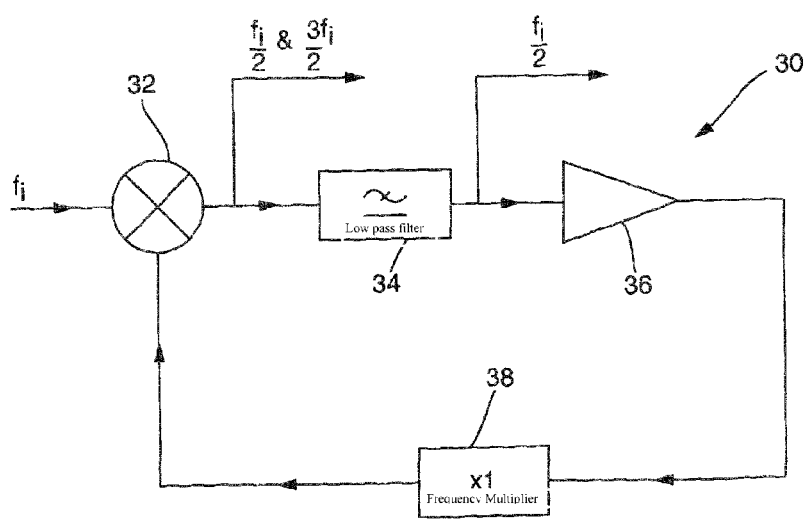
FIG. 2 is a schematic diagram of a regenerative frequency divider for use with the frequency synthesiser of FIG. 1.

In the regenerative frequency divider 30 of FIG. 2, the frequency multiplier 38 is a ×1 multiplier (i.e. N=1). Hence, the output signals from the mixer 32 are therefore $f_{out\_lower}=\frac{1}{2}f_i$ and $f_{out\_upper}=\frac{3}{2}f_i$. The low pass filter 34 is configured to reject the higher frequency signal $f_{out\_upper}$, and instead only allow the lower frequency signal $f_{out\_lower}$ to pass. Hence, if the output from the regenerative frequency divider 30 is taken from the low pass filter 34, the divider 30 achieves a frequency division of one half.

Equations (1) and (2) represent a generalised form of the output frequencies that may be obtained from a regenerative frequency divider of a type as shown in FIG. 2. Therefore, it is to be appreciated that any harmonic of a fundamental frequency may be generated by selecting the appropriate factor N of the frequency multiplier 38. Moreover, it is also possible to make use of the ability of the regenerative frequency divider 30 to multiply by a factor of 3/2, when using only a ×1 multiplier within the divider.

Figure 3:
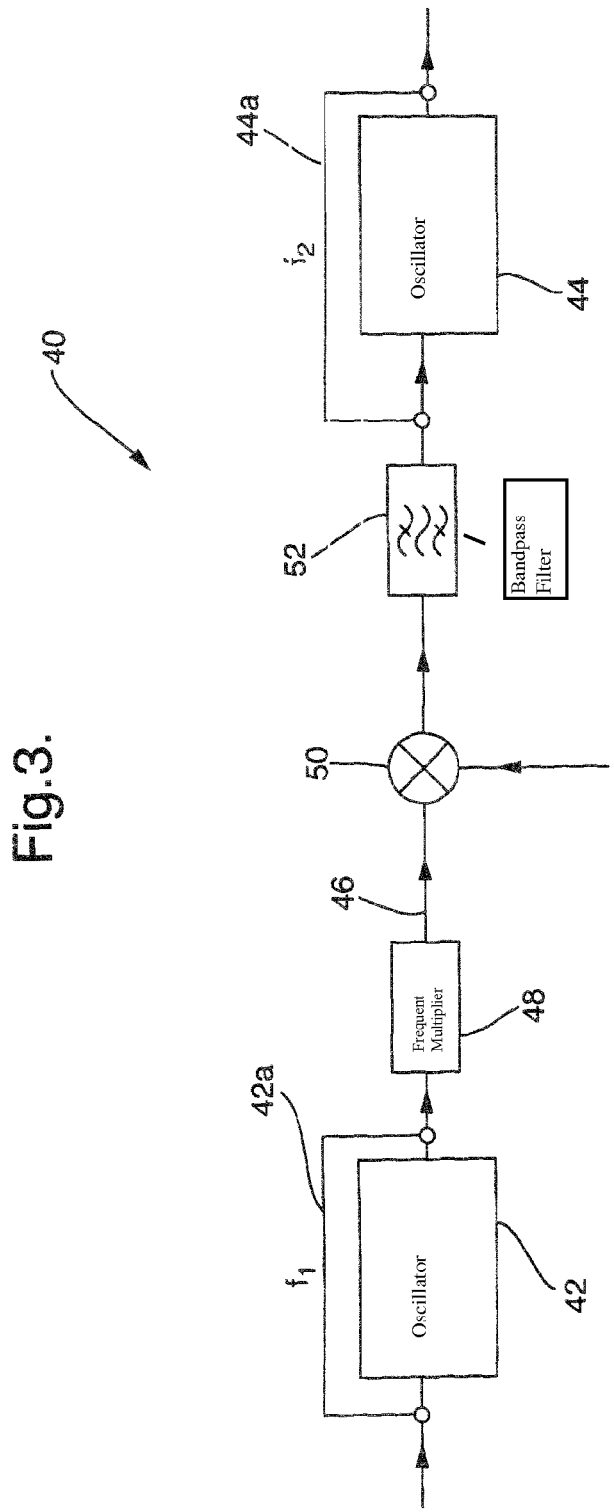
FIG. 3 is schematic diagram of a signal processing stage, showing a pair of oscillators coupled via a signal processing path.

Referring now to FIG. 3, there is shown a schematic diagram of an example signal processing stage 40. The signal processing stage 40 is intended for use with signal generating devices, such as stable local oscillators, as a noise reduction module for 'cleaning' signals within the device.

The signal processing stage 40 comprises a pair of oscillators 42, 44 coupled via a signal processing path 46, along which a signal is conveyed. Each of the oscillators 42, 44 is a voltage-controlled dielectric resonator oscillator (DRO), having an operating frequency that can be varied by adjusting the tuning voltage applied to the oscillator. In the example of FIG. 3, the DROs 42, 44 are fabricated from barium titanate. The use of barium titanate DROs is found to be particularly advantageous, as this substance has a temperature coefficient that is significantly lower than that of sapphire. As a result, the oscillators 42, 44 of the signal processing stage 40 do not require complex mechanisms for stabilising their temperature, unlike existing sapphire resonator based DROs. Furthermore, by using a pair of barium titanate DROs in place of a sapphire-resonator based oscillator, the resulting signal device can be manufactured at considerably less cost than existing devices, as sapphire components are generally quite expensive.

The signal processing path 46 that couples the oscillators 42, 44 is adapted to change the frequency of the signal that is conveyed along the path. Therefore, in the example of FIG. 3, the path 46 includes a frequency multiplier 48 and a mixer 50, which serve to successively increase the frequency of the signal (i.e. by multiplication and then mixing) as it passes between the oscillators 42, 44. Of course, it is to be understood that any suitable means for changing the frequency of the signal may be included in, or else applied to, the path 46 depending on the particular application and desired change in frequency.

As a result of the operation of the signal processing path 46, the oscillators 42, 44 are configured to operate at different frequencies to each other, such that their operating frequencies (i.e. $f_1$ and $f_2$) are dependent on the frequency of the signal applied to each oscillator. In this way, the signal on path 46 can therefore be 'cleaned' before, and after, its frequency changes, enabling any noise components (e.g. phase noise and/or spurii) to be substantially suppressed in the resulting output signal.

In FIG. 3, the first oscillator 42 corresponds to a low frequency DRO having an operating frequency $f_1$, while the second oscillator 44 is a high frequency DRO having an operating frequency $f_2$ (where $f_2>f_1$). The respective operating frequencies are selected to match the frequency of the signal as it is processed along the signal processing path 46.

Figure 4:
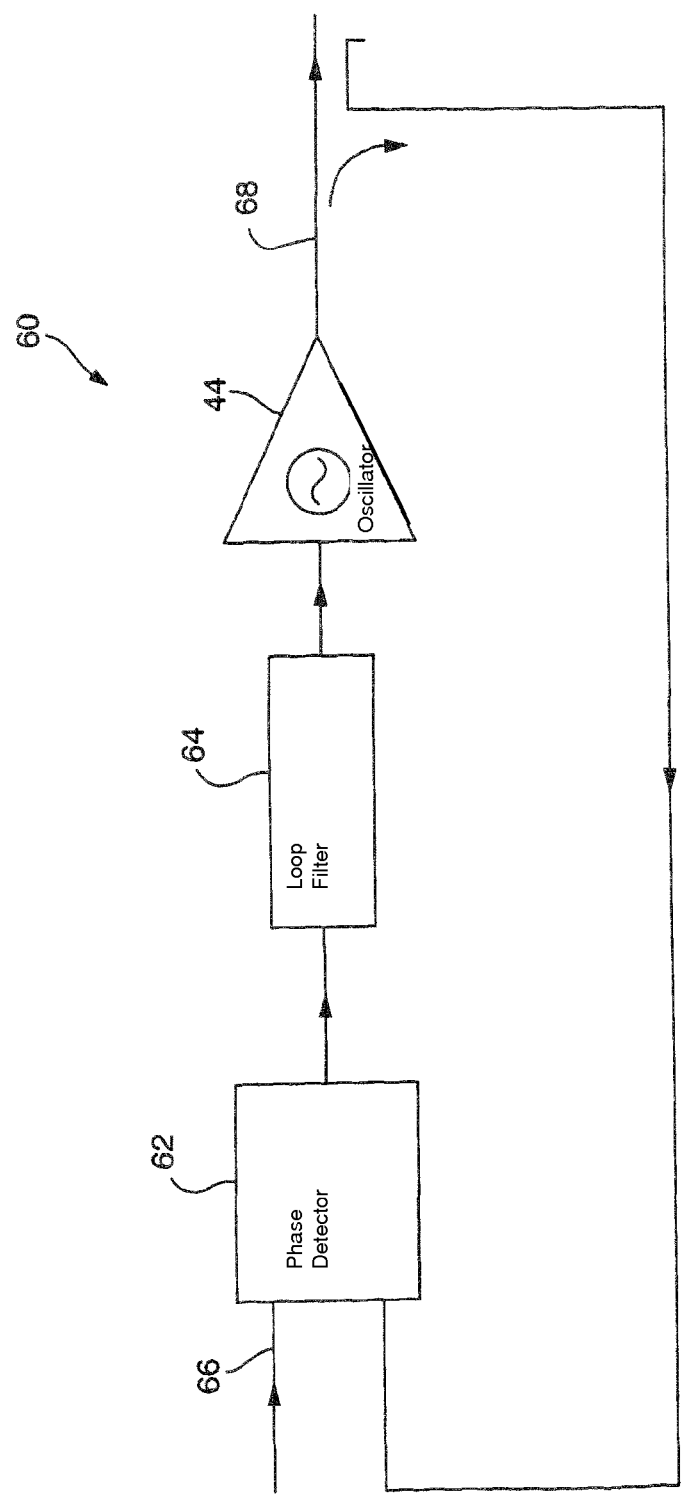
FIG. 4 is a schematic diagram of one of the oscillators of the preceding figure shown arranged in a feedback loop.

Each oscillator 42, 44 is maintained at its respective operating frequency $f_1$ and $f_2$, by way of a phase locked loop circuit, shown schematically as 42a and 44a in FIG. 3. An example of such a phase locked loop circuit 60 for use in conjunction with the DROs is shown in FIG. 4. The phase locked loop circuit 60 comprises a phase detector 62 and a loop filter 64, which are coupled to a DRO 44 in a feedback loop arrangement, so that the output from the DRO 44 is also provided as an input to the phase detector 62.

The phase detector 62 has an output voltage that is dependent on the difference in phase between the input signal 66 to the phase locked loop circuit 60 and the output signal 68 from the DRO 44. The phase locked loop acts as a low pass filter to modulation present on input signal 66. In this way, any noise or spurii components with modulation frequencies significantly higher than the phase locked loop bandwidth can then be significantly reduced, giving rise to a 'clean' output signal 68.

In the example of FIG. 4, the phase detector 62 is configured to output its maximum voltage when both the input signal 66 and output signal 68 are perfectly in phase. However, when the phase difference between the signals approaches 90 degrees, the output voltage drops to zero, which is the normal operating condition for the phase detector in the phase locked loop.

The operation of the signal processing stage 40 of FIG. 3, will now be described by way of example with reference to a sinusoidal input signal having a frequency of 1200 MHz. For the purpose of explanation, the input signal is assumed to have been derived from an associated signal source and to have undergone some degree of signal processing, which has involved passing the signal through at least one frequency multiplier (not shown). As a result of this frequency multiplication, the phase noise of the input signal to the phase locked DRO of blocks 42 and 42a is raised by 20*log 10(15) dB compared to the phase noise of the 80 MHz signal source that supplies the input to the frequency multiplier and additionally includes a residual phase noise contribution from the frequency multiplier itself. This level of phase noise is unacceptable for radar applications requiring the highest clutter improvement factor and must be suppressed using the signal processing stage of FIG. 3. Other applications than radar may also make use of the low noise properties of signal processing stage of FIG. 3.

The operating frequency of the DRO 42 is set to be 1200 MHz and the DRO 42 is locked to this frequency by action of the phase locked loop circuit 42a. Due to the function of the phase locked loop circuit 42a and the low noise characteristic of DRO 42, the resulting output signal from the DRO 42 is found to be much quieter than the input signal, for offset frequencies sufficiently spaced from the carrier, as described below. Hence, the first DRO 42 produces a 1200 MHz signal, which has significantly lower phase noise than the signal input to the phase locked loop circuit 42a, for offset frequencies sufficiently spaced from the carrier. In this way, spectral contamination of the sinusoidal signal is markedly reduced, giving rise to a 'clean' sinusoidal waveform at 1200 MHz.

It is to be noted that the phase lock circuit 42a also prevents the average frequency of the output signal from DRO 42 from drifting, with respect to the average frequency of the input signal to phase lock circuit 42a, due to temperature variations in the DRO 42. Therefore, the phase locked loop circuit 42a ensures that the frequency output from DRO 42 does not drift outside of the desired range, set by the 80 MHz signal source, of 0.1 ppm over the operating temperature range.

The amount of phase noise may be quantified by use of the following definition:

$$L(f) = 10 \cdot \log_{10}\left[\frac{P_{offset}}{P_{carrier}}\right] \quad (3)$$

where, L(f) is the single sideband phase noise at offset frequency f Hz from the carrier, which has units of dBc/Hz, $P_{offset}$ is the power in the 1 Hz band offset from the carrier frequency by f Hz due to phase modulation and $P_{carrier}$ is the power in the carrier frequency. In the above example, the carrier frequency corresponds to 1200 MHz and it is found that due to the operation of the DRO 42 and PPL circuit 42a, the resulting phase noise in a 1 Hz band offset by 10 KHz from the 1200 MHz signal is −170 dBc/Hz or equivalently $10^{-17} \times P_{carrier}$; the phase noise then decreases further with increasing offset frequency to achieve an ultimate noise floor better than −180 dBc/Hz. This compares with the phase noise of the signal applied to the input of the phase locked DRO 42 of the PLL circuit 42a, which is in the region of −150 dBc/Hz for offset frequencies in excess of 10 kHz. Hence, it is evident that the first phase locked DRO 42 significantly reduces the phase noise in the output signal, thereby producing a clean sinusoidal waveform.

The capability to reduce the phase noise to a level of $10^{-17} \times P_{carrier}$ is extremely useful for low noise signal applications, such as in radar systems etc. Therefore, the signal processing stage of FIG. 3 is particularly well suited for use with stable local oscillators intended for radar applications and RF communications networks etc.

The cleaned 1200 MHz signal is then passed through the frequency multiplier 48, which in the example of FIG. 3 is a ×3 Schottky diode multiplier. Due to the action of the multiplier, the phase noise associated with the resulting 3600 MHz sinusoidal signal from the frequency multiplier is increased by 20*Log 10(3) compared to the phase noise at the frequency multiplier input. Additionally the frequency multiplier 48 will make a residual phase noise contribution of its own. Furthermore, in addition to the wanted 3$^{rd}$ harmonic of the input signal, it is generally found that the multiplier 48 will also generate unwanted multiples of the sinusoidal signal, including at least relatively high levels of the 1$^{st}$ and 5$^{th}$ harmonics of the input frequency.

The 3600 MHz signal is then applied to mixer 50, which is also configured to receive another input signal, as shown in FIG. 3. The mixer 50 is a conventional Schottky diode mixer that suffers from the inherent characteristic that it produces lots of spurii as a result of the signal mixing. However, provided that the frequencies of the signals to be mixed are carefully selected, the spurii in the resulting output signal will be suitably spaced from the desired frequency to thereby permit ease of filtering. Hence, in the example of FIG. 3, the other input signal to the mixer 50 is selected to have a frequency of 580 MHz, which not only gives rise to an output frequency of 4180 MHz, but also produces spurii that are spaced from the 4180 MHz signal by at least 20 MHz, due to the coherent nature of the 3600 MHz and 580 MHz signals applied to the mixer inputs. As a result, the spurii accompanying the output signal can therefore be easily filtered using a conventional bandpass filter 52, as shown in FIG. 3, since any spurii at 4200 MHz and 4160 MHz are at relatively low level.

To achieve a spacing between the spurii and the desired output frequency which is suitable to permit easy filtering of the spurii, it is necessary to select only those frequencies which have a highest common divisor of sufficient value. Hence, in the example of FIG. 3, the frequencies to be mixed are 3600 MHz and 580 MHz, which are not selected by accident, but instead are known to have a highest common divisor of 20 MHz. Thus, any spurii produced by the mixer 50 will be spaced by at least 20 MHz from the output frequency of 4180 MHz, which can then be easily removed. However, if the signal mixing involves frequencies which produce spurii that are very close to the output frequency, it then becomes increasingly more difficult to filter them out, and thus the resulting signal will be inherently more noisy.

The 4180 MHz signal is filtered by the bandpass filter 52, which acts to remove, or at least reduce, the spurii spaced from the desired frequency. However, the filtered signal is likely to still contain one or more noise components, in particular phase noise and spurii generated in the mixer 50, which need to be removed from the signal by action of the second phase locked DRO 44 and 44a. The 4180 MHz signal is provided to the second DRO 44 by way of signal processing path 46. The operating frequency of the DRO 44 is set to be 4180 MHz and the DRO 44 is locked to this frequency by action of the phase locked loop circuit 44a. The phase locked loop circuit 44a compensates for the frequency variation of the free running DRO 44 with temperature, which is about ±50 kHz over the operating temperature range. Due to the function of the phase locked loop circuit 44a, the resulting output signal from the DRO 44 is found to be much quieter than the input signal, for offset frequencies significantly greater than the phase locked loop bandwidth. Hence, the second DRO 44 produces a 4180 MHz signal that has significantly lower phase noise than the signal input to the phase locked loop circuit 44a. In this way, spectral contamination of the sinusoidal signal is markedly reduced, compared to the signal available from filter 52, giving rise to a 'clean' sinusoidal waveform at 4180 MHz.

Figure 5:
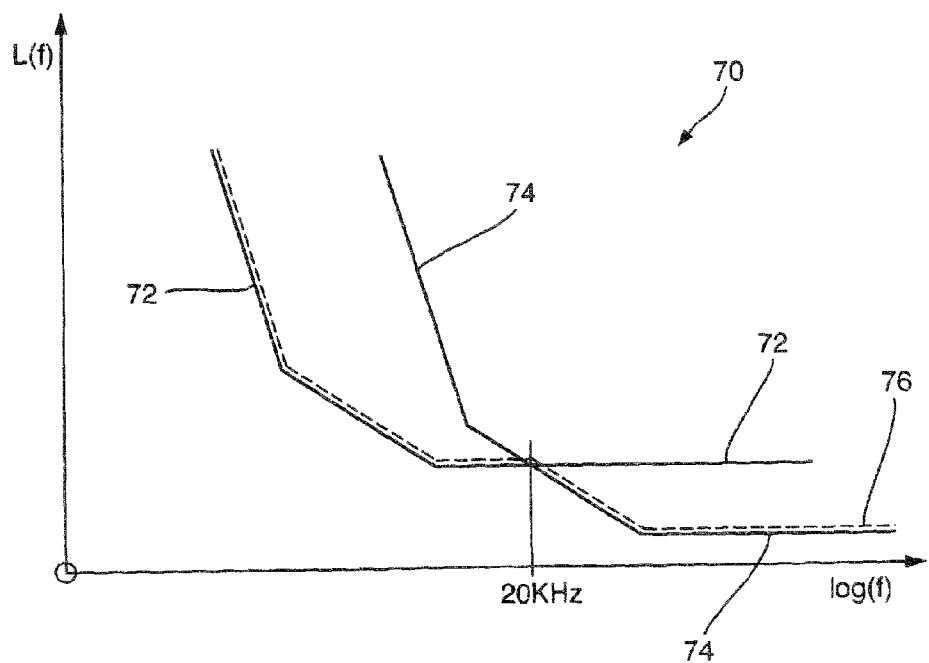
FIG. 5 is a graphical representation of the phase noise characteristics of one of the oscillators shown in the example signal processing stage of FIG. 3.

The noise reduction capability of the phase locked DRO 44 and 44a may be more clearly understood with reference to FIG. 5, which shows a plot 70 of the phase noise, L(f), against the logarithm of the offset frequency from carrier, log (f). The signal input to the phase locked loop circuit 44a has a 'phase noise curve' of a form that can reasonably well be approximated by the continuous piecewise linear curve 72, illustrating that the phase noise in the input signal decreases with increasing offset frequency. The phase noise in the signal output from the DRO 44 is shown as the corresponding continuous piecewise linear curve 74, which can be seen to be similar in shape to curve 72, but is displaced relative to it so that both curves intercept at a frequency of 20 kHz.

It is noted for reference that the phase noise departs from the continuous piecewise linear curves in the vicinity of the points at which the slope changes, but that the continuous piecewise linear approximation is reasonable for first order system calculation purposes.

It is apparent that the phase noise in the input signal is lower than the phase noise in the DRO output signal for frequencies below 20 kHz; while above this frequency the phase noise is notably higher in the input signal than the DRO output signal. Therefore, in order to reduce the overall noise in the resulting signal from the DRO 44 and phase locked loop circuit 44a combination, it is desirable to exploit the relatively low phase noise portions of both of the phase noise curves. In other words, it is beneficial to cause the DRO 44 and phase locked loop 44a combination to operate according to a phase noise curve that closely approximates a composite of the continuous piecewise linear curve 72 below 20 kHz and the continuous piecewise linear curve 74 above 20 kHz, as represented by the dashed line 76 in FIG. 5. In this way, the DRO 44 and phase locked loop 44a combination are then able to produce a clean output sinusoidal signal having an optimally low phase noise.

In order to achieve the optimum phase noise curve, the loop filter 64 in the phase locked loop circuit 60 is configured such that the phase locked loop bandwidth is set to 20 kHz, corresponding to the cross-over point (i.e. intercept) between the phase noise curves as shown in FIG. 5.

As a result of the noise reduction capability of the DRO combination, the resulting output signal on the signal processing path 46 is found to have noise characteristics that closely approximate to a signal that has been generated by a low noise sapphire resonator based DRO, at least for offset frequencies exceeding a few kHz, such as are of greatest interest for radar applications and some communications applications. Hence, by using the signal processing stage, it is possible to emulate the performance and operational characteristics of more complex, and generally more expensive, oscillators.

Figure 6:
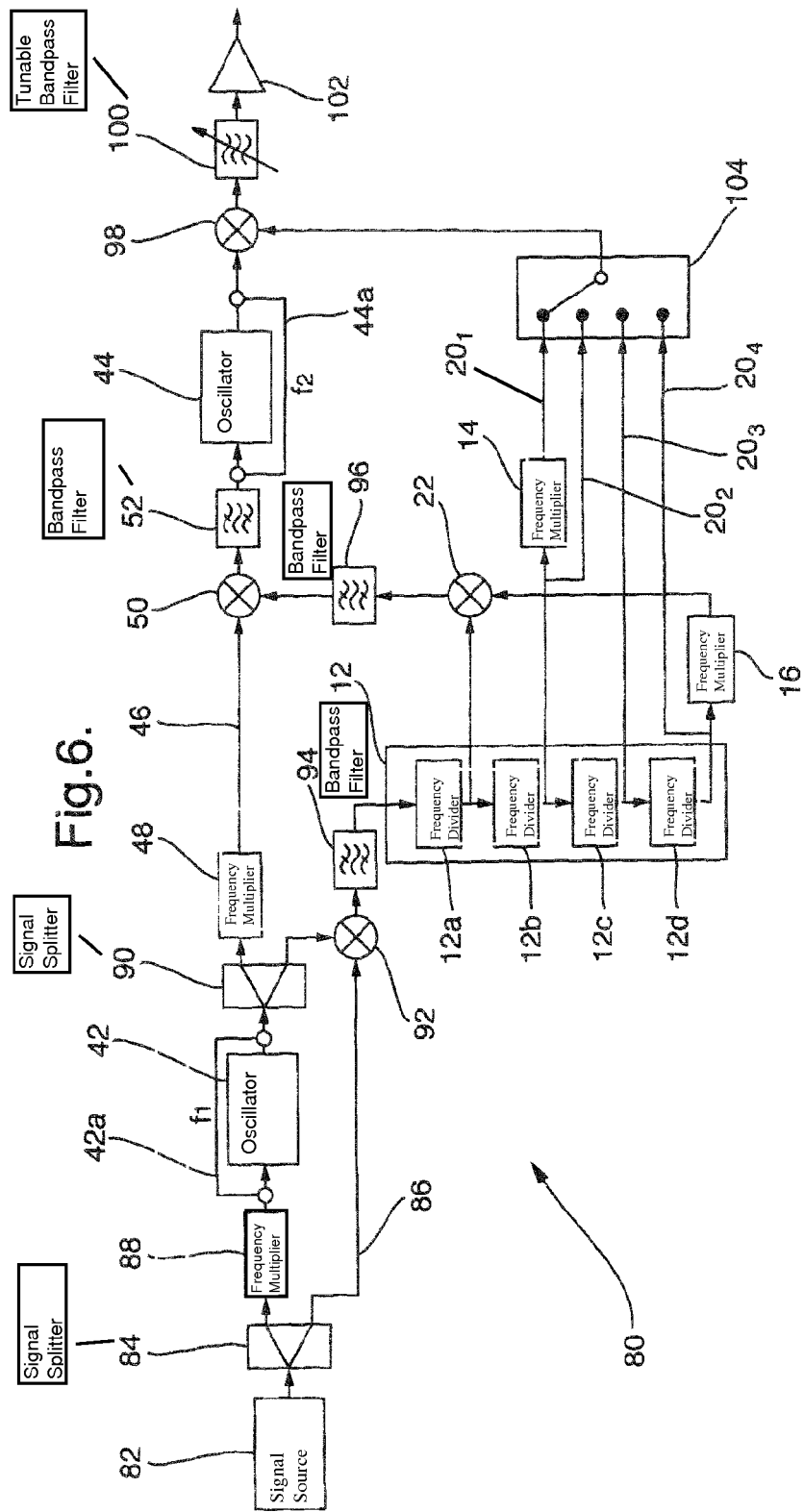
FIG. 6 is a schematic diagram of a stable local oscillator according to an embodiment of the present invention.

Referring now to FIG. 6, there is a shown a schematic diagram of an example stable local oscillator 80, according to a preferred embodiment of the present invention. The stable local oscillator 80, also commonly referred to as a "StaLO", is intended for use in low noise signal generation applications, and therefore is ideally suited for radar systems and RF communications networks etc.

The stable local oscillator 80 comprises a signal source 82 in the form of a single crystal oscillator, providing an output signal of a prescribed frequency. A benefit of basing the frequency synthesis scheme on only a single crystal oscillator is that all of the frequencies generated within the stable local oscillator 80 are coherent with each other. In the example of FIG. 6, the crystal oscillator 82 is selected to provide a sinusoidal signal at a prescribed frequency of 80 MHz. The crystal oscillator 82 is a commercial-off-the-shelf device, having an intrinsically small temperature drift of ideally 0.1 ppm over the range 0 degree C. to 50 degrees C., which provides a very low noise input signal for use within the stable local oscillator 80.

In addition to the crystal oscillator 82, the stable local oscillator 80 also comprises a signal processing stage having a structure and functionality similar to the signal processing stage 40 as described above in relation to FIG. 3; and a frequency synthesiser having a structure and functionality equivalent to the frequency synthesiser 10 as previously described in relation to FIG. 1. Therefore, for ease of reference, like components in FIG. 6 have been labelled consistently with FIGS. 1 and 3.

The signal processing stage defines a first signal processing path 46 that couples a pair of Barium Titanate DROs 42, 44 to the crystal oscillator 82 via a signal splitter 84 and ×15 frequency multiplier 88. The signal splitter 84 is arranged to receive the 80 MHz signal from the crystal oscillator 82, whereupon it splits the signal into two separate 80 MHz sinusoidal signals, each having approximately half the nominal power of the original input signal. The signal splitter 84 provides one of the 80 MHz signals to the first signal processing path 46, via ×15 frequency multiplier 88, while the other 80 MHz signal is provided to a second signal processing path 86, which couples the frequency synthesiser to the crystal oscillator 82.

Considering first the operation of the signal processing stage, the 80 MHz signal from the signal splitter 84 is applied to a ×15 frequency multiplier 88 on the first signal processing path 46, as shown in FIG. 6. The frequency multiplier 88 is a Schottky diode multiplier that multiplies the frequency of the signal to 1200 MHz. Even a quite reasonable frequency multiplier can have input referred residual phase noise in the −175 dBc/Hz region for offset frequencies greater than 20 kHz, which will exceed the phase noise of the oscillator 82 by 3 dB or more. The process of frequency multiplication will increase the frequency multiplier residual phase noise and the phase noise of oscillator 82 by 20*Log 10(15) dB.

In order to reduce the noise in the 1200 MHz signal, the signal is applied to the first phase locked DRO 42 of the PLL circuit 42a. The operating frequency of the DRO 42 is set to be 1200 MHz and the DRO 42 is locked to this frequency by action of a phase locked loop circuit 42a of a type as described above in relation to FIG. 4. Due to the function of the phase locked loop circuit 42a, the resulting output signal from the DRO 42 is found to be much quieter than the input signal for offset frequencies considerably greater than the phase locked loop bandwidth. Hence, the first DRO 42 produces a 1200 MHz signal which has significantly lower phase noise than the signal input to the phase locked loop circuit 42a. In this way, spectral contamination of the 1200 MHz sinusoidal signal available from DRO 42 is markedly reduced compared to the input to the 1200 MHz phase locked loop 42 and 42a, giving rise to a 'clean' 1200 MHz sinusoidal waveform.

The clean 1200 MHz signal is then split by a second signal splitter 90, which produces two separate 1200 MHz signals with each having approximately half the nominal power of the original signal. One of the signals is conveyed along the first signal processing path 46, while the other is provided to a mixer 92 for use with the frequency synthesiser as discussed in detail below.

The 1200 MHz signal on the first signal processing path 46 is then applied to a ×3 frequency multiplier 48 of a Schottky diode type. Due to the action of the multiplier, the phase noise of the resulting 3600 MHz sinusoidal signal is increased by at least 20*Log 10(3) dB compared to the phase noise of the input signal to the frequency multiplier. It is generally found that the multiplier 48 will also generate unwanted harmonics of the sinusoidal signal, in additional to the wanted 3$^{rd}$ harmonic of the input frequency.

The 3600 MHz signal is then applied to a mixer 50, which is also configured to receive an additional input signal from the frequency synthesiser, as shown in FIG. 6. The mixer 50 is a Schottky diode mixer that suffers from the inherent characteristic that it produces lots of spurii as a result of the signal mixing. However, provided that the frequencies of the signals to be mixed are coherent and carefully selected, the resulting output signal may contain spurii which are suitably spaced from the desired frequency to thereby permit ease of filtering.

Hence, in the example of FIG. 6, the frequency of the signal received from the frequency synthesiser is selected to be 580 MHz (as discussed below), which when mixed with the 3600 MHz signal in mixer 50, produces a signal with an output frequency of 4180 MHz. However, it is found that the resulting spurii are spaced from the desired frequency by at least 20 MHz, as the input frequencies have been specially chosen to have a highest common divisor of 20 MHz. Thus, an adequate spacing between the spurii and the desired frequency can thereby be achieved by selecting frequencies that only have a highest common divisor of sufficient value. In this way, the resulting spurii can then be readily removed by conventional filtering.

Referring again to FIG. 6, the 4180 MHz signal is filtered by the bandpass filter 52, which acts to reduce the spurii. However, the filtered signal will contain one or more noise components, in particular phase noise, and spurii which need to be removed from the signal by action of the second DRO 44. The operating frequency of the DRO 44 is set to be 4180

MHz and the DRO 44 is locked to this frequency by action of a phase locked loop circuit 44a of a type as described in relation to FIG. 4.

The phase locked loop circuit 44a compensates for the frequency drift of approximately 100 kHz (i.e. ±50 kHz) of the voltage-controlled DRO 44, which is created by the range of operating temperatures. Additionally due to the function of the phase locked loop circuit 44a, the resulting output signal from the DRO 44 is found to be much quieter than the input signal for offset frequencies considerably in excess of the phase locked loop bandwidth. Hence, the second DRO 44 produces a 4180 MHz signal that has significantly lower phase noise than the signal input to the phase locked loop circuit 44a. In this way, spectral contamination of the 4180 MHz sinusoidal signal available from DRO 44 is markedly reduced compared to the input to the 4180 MHz phase locked loop 44 and 44a, giving rise to a 'clean' 4180 MHz sinusoidal waveform The 4180 MHz signal is then provided as input to mixer 98, which is arranged to also receive a selected one of the set of harmonic frequencies generated by the frequency synthesiser, as described in detail below. These two input frequencies may then be mixed to produce a signal having a desired output frequency, while also possessing spurii that are suitably spaced to permit easy filtering. Thereafter, the signal can then be filtered by way of a tunable bandpass filter 100 which is able to significantly reduce the spurii in the output signal.

The filtered signal is then amplified by amplifier 102 before being output by the stable local oscillator 80.

Referring again to FIG. 6, the other 80 MHz signal from the signal splitter 84 is provided to the second signal processing path 86, whereupon it enters a mixer 92. The mixer 92 is a Schottky diode mixer that is arranged to also receive one of the 1200 MHz signals from the signal splitter 90, thereby giving rise to an output signal having a frequency of 1280 MHz. As a result of the mixing, a number of spurii are also produced, but due to the coherent nature and careful selection of the mixing frequencies it is found that the closest spurii are spaced by 80 MHz from the output frequency, since the highest common denominator of 1200 MHz and 80 MHz is 80.

The resulting 1280 MHz signal is then filtered by a bandpass filter 94, which due to the spacing of the spurii is able to significantly reduce, the spurii associated with the signal.

In order to generate a set of harmonic frequencies, the filtered 1280 MHz signal is then provided to an array 12 of ½ frequency dividers $12a \ldots 12d$ within the frequency synthesiser. The frequency of the signal is initially reduced by frequency divider 12a, so that the signal from the divider now has a frequency of 640 MHz. This signal is then provided to the next frequency divider 12b, which again reduces the frequency of the signal by one half. The output signal now has a frequency of 320 MHz, which is made available on channel $20_2$. A ×¾ frequency multiplier 14 is also coupled to the output of the frequency divider 12b, so that it too receives the 320 MHz signal, which is thereby multiplied by ¾ giving a further output signal having a frequency of 240 MHz on channel $20_1$.

Due to the cascading of the frequency dividers, the 320 MHz output signal is also provided to frequency divider 12c, which again reduces the frequency by one half. In this way, an output signal having a frequency of 160 MHz is made available on channel $20_3$, while also being provided to the final frequency divider 12d, which reduces the 160 MHz signal into an output signal of 80 MHz. This 80 MHz signal is then made available on channel $20_4$. As a result, an evenly spaced set of the first four successive harmonics (i.e. 80 MHz, 160 MHz, 240 MHZ and 320 MHz) of the crystal oscillator frequency 80 MHz can be obtained from the channels $20_1 \ldots 20_4$ of the frequency synthesiser.

As shown in FIG. 6, the output from the first frequency divider 12a is also coupled to a mixer 22, which is arranged to receive both the output signals from frequency divider 12a and a ×¾ frequency multiplier 16. The frequency multiplier 16 is coupled to the output of the final frequency divider 12d, and therefore is able to produce a signal having a frequency of 60 MHz. The 640 MHz and 60 MHz signals are consequently mixed in mixer 22, with the resulting signal being passed through a bandpass filter 96. However, due to the desired operation of the stable local oscillator 80, the filter 96 is arranged to select only the difference frequency in the resulting signal, i.e. 580 MHz. This signal is then provided to the mixer 50 in the first signal processing path 46, for subsequent processing as described above.

The set of harmonic frequencies on channels $20_1 \ldots 20_4$ can be selected by way of a conventional low noise pin diode switch 104, which is configured to couple a respective channel to the mixer 98. In this way, any one of the harmonics can thereby be mixed with the cleaned 4180 MHz from the second DRO 44. As a result, the output frequency from the stable local oscillator 80 can consequently be controllably varied, enabling the device to be frequency agile, which is particularly useful for radar and RF communications applications etc.

It is to be appreciated that mixing of coherent frequencies plays an important role in reducing noise in signal applications. Therefore, it should be understood that where mixing takes place, care has been taken to ensure that each of the frequencies are coherent, and that they additionally have values which are conducive to permit easy filtering of any spurii.

Referring now to FIG. 7, there is shown a schematic diagram of an example regulated power supply 110 for use with low noise signal devices. The power supply is particularly well-suited for providing power to noise sensitive components, such as frequency dividers, frequency multipliers and amplifiers etc.

The power supply 110 comprises a passive filter 112, a first regulator 114 and a second regulator 116. The filter 112 is a conventional low pass filter that is coupled, in series connection, to the first and second regulators 114, 116. The function of the filter 122 is to filter noise components and reject unwanted frequencies, generally above several 10s of kHz.

The first and second regulators 114, 116 are both linear regulators. The first regulator 114 is a commercial-off-the-shelf (COTS) device, which functions as a first voltage stabilisation stage to suppress noise components in the input voltage. Therefore, the first regulator 114 acts as a conventional linear voltage regulator.

The second regulator 116 is a low noise regulator that is operable to reduce noise in the output voltage, $V_{out}$, by suppressing noise input from regulator 114, both due to the regulators 114 own internal noise and due to ripple and noise present in $V_{in}$ that has undergone considerable suppression in filter 112 and regulator 114. The low output noise from regulator 116 is achieved in part by operating the regulator with low loop bandwidth, which will tend to suppress, at frequencies reasonably well above the loop bandwidth of the regulator 116, both the noise and ripple supplied to regulator 116 input from regulator 114 and also regulators 116 internal noise sources. Also regulator 116 has been designed so that its internal noise sources are low, at frequencies within the regulator loop bandwidth. Since the regulated power supply 110 is intended for use with components such as frequency dividers etc., the supply does not need to respond to rapid changes in current, as such components only typically require a constant current supply. Therefore, the second regulator is configured to have a loop bandwidth substantially at or below 1 kHz.

To reduce the risk of a potentially damaging over voltage condition occurring at the output terminal 122, regulator 116 is designed as a low dropout voltage regulator, to limit the output voltage $V_{out}$ in response to a failure of either, but not both, of regulators 114 and 116. If regulator 116 fails in the over voltage condition then $V_{out}$ will not be larger than the output voltage from regulator 114, which is arranged to be harmless to the devices being supplied by the supply 110. Alternatively, if regulator 114 fails, then regulator 116 will continue to provide output voltage within the required limits. In this way, a considerable reduction in the risk, due to over voltage, of damage to attached components can thereby be achieved.

It is noted that the present regulated power supply is generally rated as a 15V output supply. However, it is to be appreciated that any desired output voltage can be provided depending on the particular application and supply requirements.

To provide further protection against any undesirable voltage spikes and/or over-voltage events, the regulated power supply 110 also comprises an over-voltage protection circuit 118 that is configured to attempt to set the output voltage of both regulators 114 and 116 to 0V in response to a failure of either, or both, regulators 114, 116. The protection circuit 118 is arranged to provide a 'shutdown' signal to both regulators, to thereby quickly prevent any anomalous variations in the output voltage, $V_{out}$, from the supply. In this regard the low loop bandwidth of the output regulator is particularly helpful in that output voltage changes from regulator 116 tend to happen with a low rate of change of output voltage with respect to time, so that the over voltage protection 118 has more time to act before the over voltage becomes a problem. The over-voltage protection circuit 118 acts by removing bias to the series pass transistors of regulators 114 and 116.

It is found that the regulated power supply is able to provide a very stable, low noise output voltage, as a result of the combined filtering and voltage regulating stages. Therefore, it is ideally suited for use in conjunction with noise sensitive components.

The invention claimed is:

1. A local oscillator, comprising:
   a signal source for generating an input signal having a prescribed frequency;
   a first oscillator and a second oscillator coupled via a first signal path with the signal source;
   an array of frequency dividers coupled via a second signal path with the signal source;
   at least one frequency multiplier coupled to at least one of the frequency dividers; and
   a switch coupled to the array of frequency dividers and the at least one frequency multiplier,
   wherein in use, the frequency dividers and the at least one multiplier are operable to generate a plurality of harmonic frequencies coherent with the prescribed frequency for selectively combining with output from the oscillators on the first signal path to generate an output signal having a target frequency, the switch being operable to select which of the plurality of harmonic frequencies is to be combined, and,
   wherein the array of frequency dividers and at least one multiplier are arranged to generate the harmonics frequencies such that they are evenly spaced relative to each other.

2. The local oscillator as in claim 1 wherein the frequency dividers are cascaded.

3. The local oscillator as in claim 1, wherein each frequency divider is a regenerative frequency divider.

4. The local oscillator as in claim 1, wherein the local oscillator comprises a pair of frequency multipliers, each multiplier coupled to a respective one of the frequency dividers.

5. The local oscillator as in claim 4, wherein the array of frequency dividers and the pair of frequency multipliers are configured to generate each successive harmonic up to a predetermined integer multiple of the prescribed frequency.

6. The local oscillator as in claim 1, wherein each oscillator of the first oscillator and the second oscillator is configured to have an operating frequency different to that of the other oscillator and is dependent on the frequency of the signal provided to the respective oscillator.

7. The local oscillator as in claim 6, wherein, in use, each of the first oscillator and the second oscillator is maintained at substantially its respective operating frequency to thereby reduce one or more noise components in the signal conveyed along the first signal path.

8. The local oscillator as in claim 1, wherein one of the oscillators of the first oscillator and the second oscillator operates at a frequency that is relatively lower than the operating frequency of the other oscillator.

9. The local oscillator as in claim 8, wherein each of the first oscillator and the second oscillator is maintained at substantially its respective operating frequency by way of a feedback loop.

10. The local oscillator as in claim 9, wherein the feedback loop is a phase locked loop.

11. The local oscillator as in claim 1, wherein each oscillator of the first oscillator and the second oscillator is a dielectric resonator oscillator.

12. The local oscillator as in claim 11, wherein each dielectric resonator oscillator is voltage controlled.

13. The local oscillator as in claim 1, wherein the first and second signal paths include respective means for changing the frequency of the signal conveyed along those paths.

14. The local oscillator as in claim 1, wherein the signal source is a single frequency crystal oscillator.

15. The local oscillator as in claim 1, wherein the switch comprises a pin diode switch for selecting the required harmonic of the prescribed frequency.

16. The local oscillator as claim 1, wherein the local oscillator is frequency agile.

* * * * *